United States Patent [19]

Nakagawa et al.

[11] Patent Number: 5,212,396

[45] Date of Patent: * May 18, 1993

[54] CONDUCTIVITY MODULATED FIELD EFFECT TRANSISTOR WITH OPTIMIZED ANODE EMITTER AND ANODE BASE IMPURITY CONCENTRATIONS

[75] Inventors: Akio Nakagawa, Hiratsuka; Hiromichi Ohashi, Yokohama, both of Japan

[73] Assignee: Kabushiki Kaisha Toshiba, Kawasaki, Japan

[*] Notice: The portion of the term of this patent subsequent to Aug. 25, 2004 has been disclaimed.

[21] Appl. No.: 807,752

[22] Filed: Dec. 17, 1991

Related U.S. Application Data

[63] Continuation of Ser. No. 355,828, May 22, 1989, abandoned, which is a continuation of Ser. No. 61,505, Jun. 15, 1987, abandoned, which is a continuation-in-part of Ser. No. 858,854, Apr. 30, 1986, Pat. No. 4,689,647, which is a continuation of Ser. No. 677,092, Nov. 30, 1984, abandoned.

[30] Foreign Application Priority Data

Nov. 30, 1983 [JP] Japan ................... 58-224089
Jun. 30, 1984 [JP] Japan ................... 59-135904

[51] Int. Cl.$^5$ ............. H01L 23/58; H01L 29/76; H01L 27/095; H01L 23/48
[52] U.S. Cl. .................... 257/212; 257/342; 257/471; 257/737; 257/784
[58] Field of Search .............. 357/22, 38, 43, 23.4, 357/86

[56] References Cited

U.S. PATENT DOCUMENTS

| | | | |
|---|---|---|---|
| 3,324,359 | 6/1967 | Gentry | 357/38 |
| 4,219,832 | 8/1980 | Naito et al. | 357/38 |
| 4,243,999 | 6/1981 | Azuma et al. | 357/38 |
| 4,364,073 | 12/1982 | Becke et al. | 357/23.4 |
| 4,502,070 | 2/1985 | Leipold et al. | 357/23.4 |
| 4,689,647 | 8/1987 | Nakagawa et al. | 357/23.4 |
| 4,713,679 | 12/1987 | Terasawa et al. | 357/38 |
| 4,767,722 | 8/1988 | Blanchard | 357/23.4 |
| 4,799,095 | 1/1989 | Baliga | 357/38 |
| 4,811,072 | 3/1989 | Risberg | 357/38 |
| 4,821,095 | 4/1989 | Temple | 357/23.4 |

FOREIGN PATENT DOCUMENTS

| | | | |
|---|---|---|---|
| 60-196974 | 10/1985 | Japan | 357/23.4 |
| 60-254658 | 12/1985 | Japan | 357/23.4 |
| 61-82477 | 4/1986 | Japan | 357/23.4 |
| 61-123184 | 6/1986 | Japan | 357/23.4 |
| 2150753 | 11/1984 | United Kingdom | 29/78 |

OTHER PUBLICATIONS

"Newest Semiconductor Technology", 1971, Dec. 5, p. 250, FIG. 1.
Semiconductor devices physics and technology, Jan. 1985, Chapter 2, p. 38, by S. M. Sze.

*Primary Examiner*—Rolf Hille
*Assistant Examiner*—Steven Loke
*Attorney, Agent, or Firm*—Oblon, Spivak, McClelland, Maier & Neustadt

[57] ABSTRACT

A COM switching device includes an n$^+$-type layer formed on a p$^+$-type layer, p$^+$-type regions formed in the surface areas of an n$^-$-type layer formed on the n$^+$-type layer, n$^+$-type regions formed in the surface areas of the p$^+$-type regions, and a gate electrode formed on an insulating layer over the surface areas of the p$^+$-type regions which lie between the n$^+$-type regions and the n$^-$-type layer. The n$^+$-type layer is formed such that the amount of impurities per unit area is between $5 \times 10^{13}$ cm$^{-2}$ and $1 \times 10^{15}$ cm$^{-2}$, and the p$^+$-type layer is formed to have an impurity concentration between $2 \times 10^{18}$ and $8 \times 10^{18}$ cm$^{-3}$.

23 Claims, 9 Drawing Sheets

CONDUCTIVITY MODULATED FIELD EFFECT TRANSISTOR WITH OPTIMIZED ANODE EMITTER AND ANODE BASE IMPURITY CONCENTRATIONS

CROSS-REFERENCE TO RELATED APPLICATION

This application is a continuation of application Ser. No. 07/355,828, filed on May 22, 1989, now abandoned, which is a continuation of application Ser. No. 07/061,505 filed Jun. 15, 1987, now abandoned which is a Continuation-In-Part of our copending application Ser. No. 858,854, filed on Apr. 30, 1986, which is a Continuation Application of our application Ser. No. 677,092, filed Nov. 30, 1984, which is now abandoned.

BACKGROUND OF THE INVENTION

The present invention relates to a conductivity modulated semiconductor device which is used as a power switching device.

Recently, power MOSFETs have become available as power switching elements, but an element having a blocking voltage over 1000 V and a sufficiently low ON-state resistance has not appeared yet. This is because, in an ordinary power MOSFET, an ON-state resistance RON increases with the increase in blocking voltage VB. It is known that the following relation between them exists.

$$RON \propto VB^{2.5}$$

To solve such a problem, it has been considered to use a conductivity modulated (COM) FET as a power MOSFET. As shown in FIG. 1, this COMFET comprises a p+-type drain region 1; an n--type high resistance layer 2 formed on the drain region 1; p+-type regions 3-1 and 3-2 selectively formed in the surface area of the high resistance layer 2; and n+-type regions 4-1 and 4-2 formed in the surface area of the p+-type regions 3-1 and 3-2. The surface regions of the p+-type regions 3-1 and 3-2 between the high resistance layer 2 and the n+-type regions 4-1 and 4-2 act as the channel regions. Namely, a gate electrode 5 is formed on a gate insulating film 6 over the surface regions of the high resistance layer 2 and p+-type regions 3-1 and 3-2 which lie between the n-type regions 4-1 and 4-2. In addition, a first source electrode 7-1 is formed on the p+- and n+-type regions 3-1 and 4-1; a second source electrode 7-2 is formed on the p+- and n+-type regions 3-2 and 4-2; and a drain electrode 8 is formed under the p+-type region 1. The structure of this COMFET is equivalent to a power MOSFET, called a vertical diffusion MOSFET, except that the drain region is formed by the p+-type layer instead of the n+-type layer.

The operation of this COMFET will now be described.

When the source electrodes 7-1 and 7-2 are grounded and a positive voltage is applied to the gate electrode and to the drain electrode 8, inverted layers, that is, channels are formed in the surface regions of the p+-type regions 3-1 and 3-2 immediately beneath the gate electrode 5 in a similar manner as in the vertical DMOSFET. In this way, the COMFET is turned on similarly to the vertical DMOSFET. However, when the COMFET is turned on, holes are injected from the p+-type drain region 1 to the n--type high resistance layer 2 as well and are accumulated therein, thereby reducing the resistance value of the high resistance layer 2. This conductivity modulation effect makes it possible to increase the blocking voltage of the COMFET to a high value and to sufficiently decrease the ON-state resistance.

The COMFET shown in FIG. 1 has the drawback that the turn-off time is longer than that in the vertical DMOSFET. This is because it takes a long time for the carriers stored in the n--type layer 2 to disappear.

FIG. 2 is a waveform diagram showing the operation of the COM switching device shown in FIG. 1. As will be obvious from this characteristic waveform diagram, when the COM switching device receives a gate voltage at the gate electrode 5 at time $t_N$, channels are formed in the surface regions of the p+-type regions 3-1 and 3-2; so that a drain current rapidly increases to a predetermined value. When the supply of this gate voltage is shut off at time $t_F$, the drain current rapidly decreases to 0. The turn-off characteristic of the COM switching device includes first and second phases PH1 and PH2. In the first phase PH1, the channels in the p+-type regions 3-1 and 3-2 disappear since the gate voltage becomes 0. Also, the electron currents flowing through these channels are shut out. Thus, a part of the drain current which is carried by elements is reduced instantaneously. In the second phase PH2, the carriers remaining in the n--type layer 2 flow through the n--type layer 2 and p+-type region 1 due to the transistor action which is executed by the p+-type regions 3-1 and 3-2, n--type layer 2 and p+-type region, and they are extinguished in accordance with the lifetime of those carriers. Thus, the drain current gradually decreases to 0.

In a conventional COM switching device whereby an impurity concentration and a thickness of the n--type layer 2 are, respectively, $1 \times 10^{14}$ (cm$^{-3}$) and 40 to 50 ($\mu$m), the turn-off time TOF is longer than 10 ($\mu$ sec).

SUMMARY OF THE INVENTION

It is an object of the present invention to provide a COM semiconductor device having a low enough ON-state resistance in which the turn-off time is sufficiently reduced.

This object is accomplished by a semiconductor device comprising a first semiconductor region of a first conductivity type; a second semiconductor region of a second conductivity type which is formed on the first semiconductor region and has a total amount of impurities of more than $5 \times 10^{13}$ cm$^{-2}$ per unit area; a third semiconductor region of the second conductivity type which has an impurity concentration lower than that of said second semiconductor region and is formed on the second semiconductor region; a fourth semiconductor region of the first conductivity type formed in the surface area of the third semiconductor region; a fifth semiconductor region of the second conductivity type formed in the surface area of the fourth semiconductor region; a gate electrode formed on an insulating layer over the surface area of the fourth semiconductor region which lies between the third and fifth semiconductor regions; a source electrode formed in contact with the fourth and fifth semiconductor regions; and drain electrode formed in contact with the first semiconductor region.

In this semiconductor device, since the injection of the minority carrier from the first semiconductor region to the third semiconductor region is remarkably restricted due to the presence of the second semiconductor region, the number of the minority carriers which remain in the third semiconductor region when the device is turned off is small, thereby allowing the turn-off time to be remarkably shortened.

DESCRIPTION OF THE PREFERRED EMBODIMENTS

Figure 3:
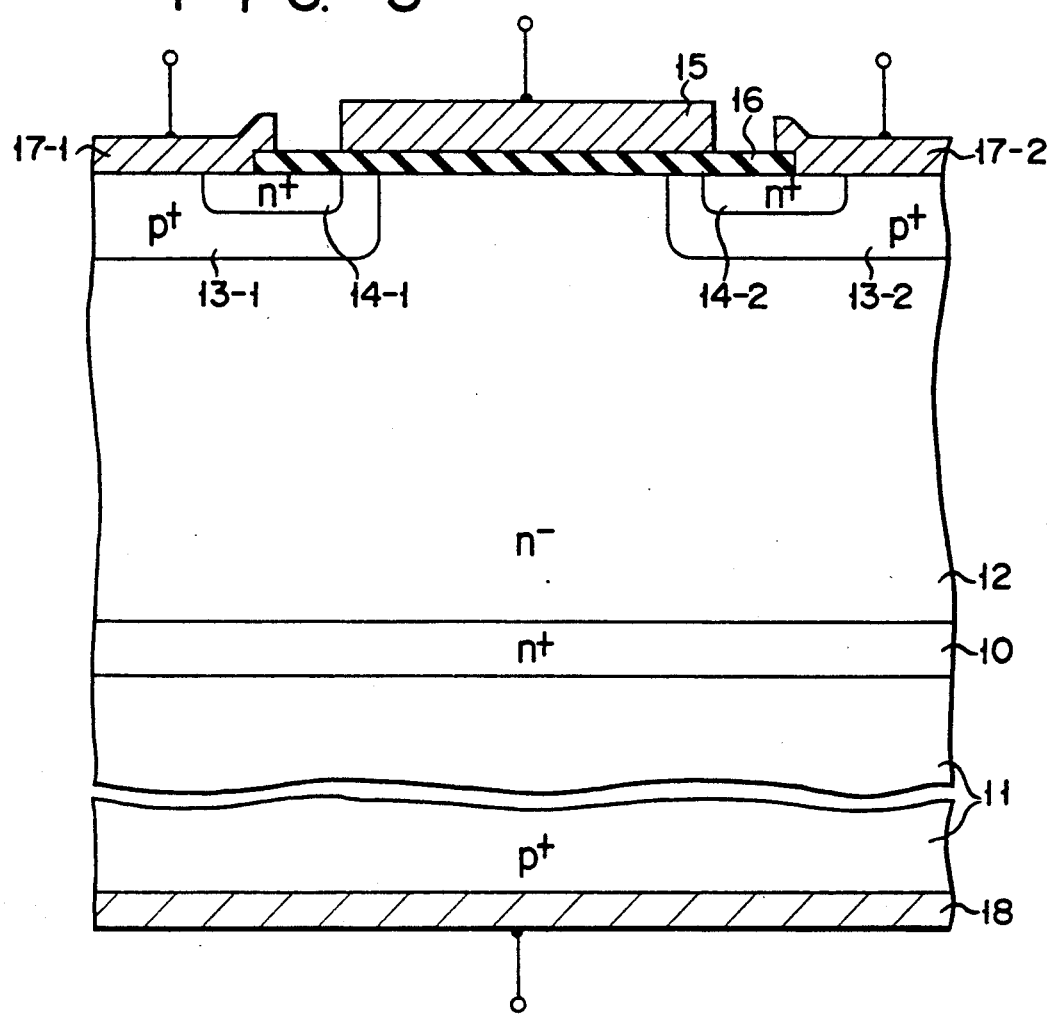
FIG. 3 is a schematic cross sectional diagram showing a cross-sectional structure of a COM switching device according to one embodiment of the present invention.

FIG. 3 shows a COM semiconductor device according to one embodiment of the present invention. This semiconductor device includes an n+-type layer 10 having an impurity concentration of $6 \times 10^{17}$ cm$^{-3}$ and a thickness of 5 $\mu$m which is formed on a p+-type substrate 11 having an impurity concentration of $2 \times 10^{18}$ to $8 \times 10^{18}$ cm$^{-3}$; an n−-type layer 12 having an impurity concentration of $3 \times 10^{14}$ cm$^{-3}$ and a thickness of 40 $\mu$m which is formed on the n+-type layer 10; p+-type regions 13-1 and 13-2 formed in the surface regions of the n−-type layer 12 to have a depth of up to 5 $\mu$m by a selective diffusion technique; and n+-type regions 14-1 and 14-2 formed in the surface regions of the p+-type regions 13-1 and 13-2. A gate electrode 15 is formed over the surfaces of the p+-type regions 13-1 and 13-2 and n−-type layer 12 between the n+-type regions 14-1 and 14-2 on a gate insulating film 16 formed by high temperature thermal oxidation. Further, source electrodes 17-1 and 17-2 are respectively formed in ohmic-contact with the p+- and n+-type regions 13-1 and 14-1 and with the p+- and n+-type regions 13-2 and 14-2.

The electrodes 15, 17-1 and 17-2 are formed in the manner such that, for example, after a 5 $\mu$m layer of aluminum was formed by vapour-evaporation technique, it is subjected to the etching processing. Further, a drain electrode 18 consisting of a V-Ni-Au film is formed under the p+-type layer 11.

Figure 1:
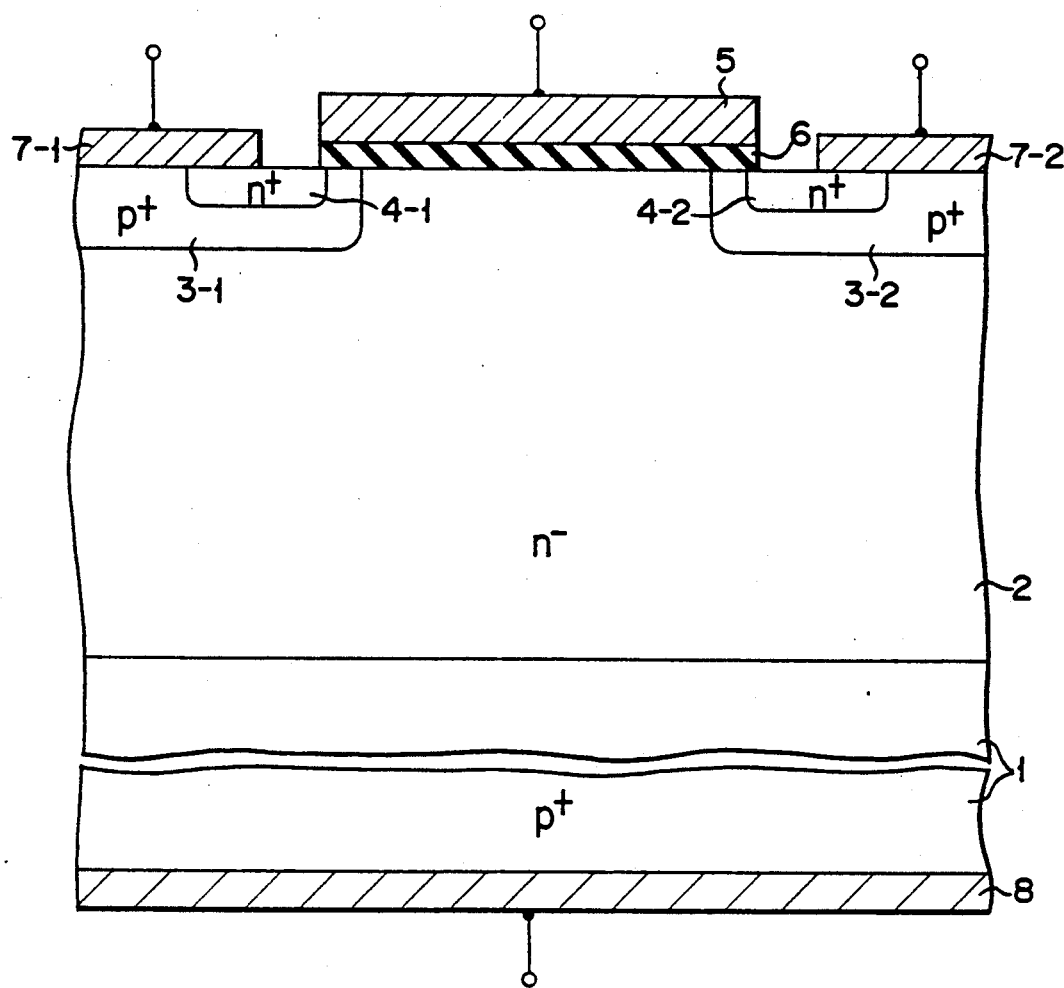
FIG. 1 is a schematic cross sectional diagram showing a cross-sectional structure of a conventional COM switching device.
Figure 2:
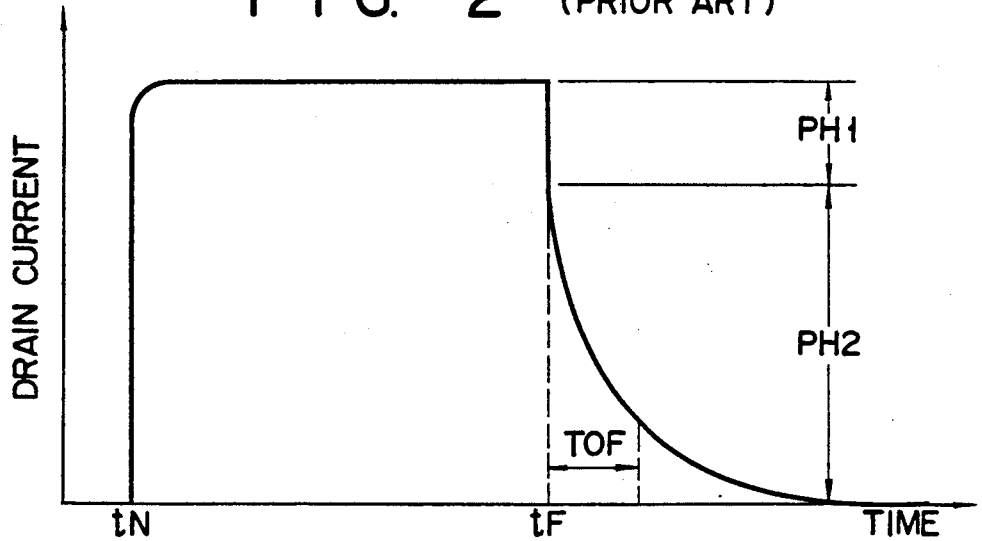
FIG. 2 is a drain current characteristic diagram to show the switching operation of the COM switching deice shown in FIG. 1.
Figure 4:
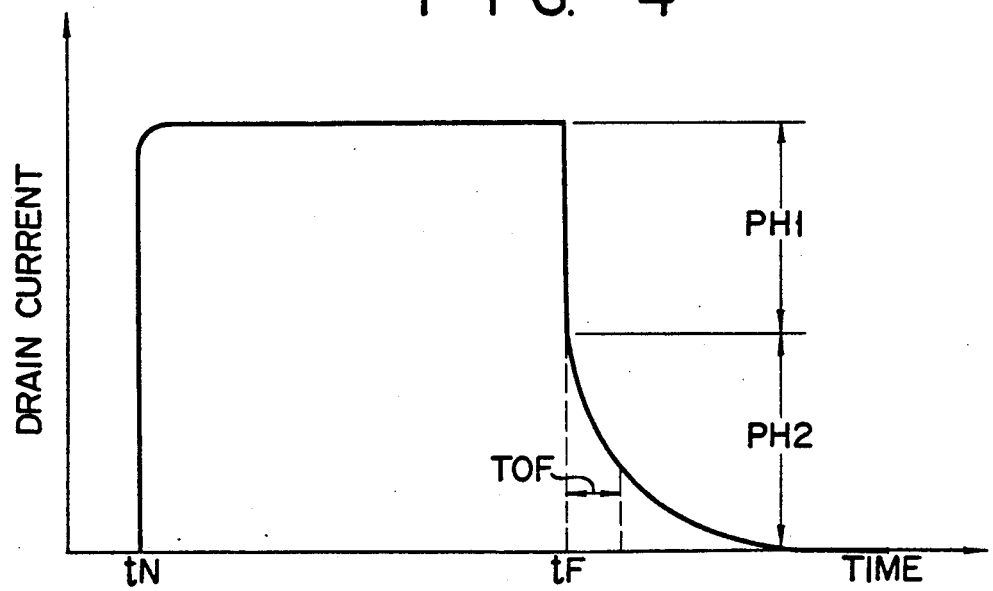
FIG. 4 is a drain current characteristic diagram for explaining the switching operation of the COM switching device shown in FIG. 3.

The switching operation of the COM switching device shown in FIG. 3 will be explained with reference to a characteristic diagram shown in FIGURE 4. When a positive gate voltage is applied to the gate electrode at time $t_N$ in the state whereby a positive voltage is applied to the drain electrode 18 and the source electrodes 7-1 and 7-2 are grounded, channels are formed in the surface regions of the p+-type regions 13-1 and 13-2, so that a hole current flows through the p+-type layer 11, n+-type layer 10, n−-type layer 12, and p+-type regions 13-1 and 13-2, an electron current flows from the n+-type regions 14-1 and 14-2 through a different path, or channels, and the drain current rapidly increases to a predetermined value. In this case, the injection efficiency of holes from the p+-type substrate 11 to the n−-type layer 12 is greatly decreased due to the presence of the n+-type layer 10. Therefore, the ratio of the electron current component in the current flowing through the n−-type layer 12 in the ON-state increases. Thus, when the gate voltage is set to 0 V at time $t^F$, the channels disappear and the electron current is immediately interrupted, causing the drain current in the first phase PH1 to be remarkably reduced. Thereafter, in the second phase PH2, the residual carriers in the n−-type layer 12 gradually flow in the direction to the drain electrode 18 and to the source electrodes 7-1, 7-2 and are extinguished. Due to this, the turn-off time TOF until the drain current decreases from 90% of an initial value to 10% is about 6 $\mu$sec, so that the TOF is shortened by about one-half compared with the switching device shown in FIG. 1.

Figure 5A:
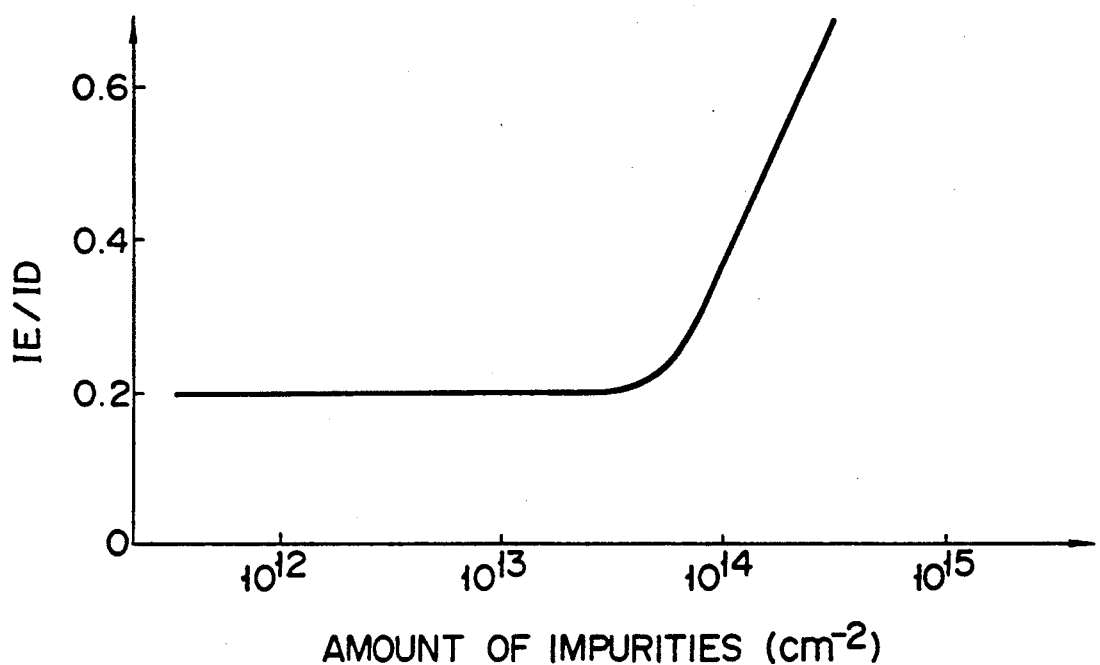
FIG. 5A is a graph showing a change in the ratio of the electron current component to the drain current when the impurity concentration of the n+-type layer in the COM switching device shown in FIG. 3 is changed.

FIG. 5A is a characteristic diagram obtained by the theoretical calculations, showing the relation between an amount of impurities per unit area of the n+-type layer 10 in the COM switching device shown in FIG. 3 and the ratio (IE/ID) of a drain current ID and an electron current component IE in the ON-state. As will be obvious from FIG. 5A, when the amount of impurities of the n+-type layer 10 is larger than 4 to $5 \times 10^{13}$ (cm$^{-2}$), the ratio IE/ID of the electron current component IE to the drain current ID rapidly increases.

In the COM switching device in FIG. 3, a semiconductor device is known which raises the punch-through withstanding voltage of the n−-type layer 12 by forming, in place of the n+-type layer 10, an n-type layer having an impurity concentration of $2 \times 10^{16}$ cm$^{-3}$, a thickness of 15 $\mu$m and, eventually, an amount of impurities per unit area of $3 \times 10^{13}$ cm$^{-2}$. However, even if the n-type layer having the amount of impurities on the order of $3 \times 10^{13}$ cm$^{-2}$ is used, the ratio IE/ID will hardly change, as is obvious from FIG. 5, so that the effect which can be obtained in the present invention will not be possible. That is, by setting the amount of impurities of the n+-type layer 10 to be, for instance $5 \times 10^-$cm$^{-2}$ or more, an effect such as shortening the turn-off time is obtained. In addition, in this case, by setting the amount of impurities of the n+-type layer 10 at, for example, about $5 \times 10^{13}$ to $1 \times 10^{15}$ (cm$^{-2}$), the ratio of the electron current component IE to the drain current ID increases. At the same time, the ON-state resistance of this COM switching device can be made sufficiently small compared with that in a conventional DMOSFET.

A certain condition must be put on the impurity concentration of p+-type substrate 11. When the impurity concentration becomes higher than $1 \times 10^{19}$ cm$^{-3}$, a three-layer structure of n$^-$/n$^+$/p$^+$ cannot easily be fabricated in forming the device by an epitaxial growth method. To form the three-layer structure, an n$^+$-type layer is formed on a p$^+$-type layer and then an n$^-$-type layer is formed on the n$^+$-type layer. Since, in this case, the impurity concentration of the n$^-$-type layer is low, part of the n$^-$-type layer can be easily changed to p$^-$-type layer due to the presence of p$^+$-type layer so as to have a structure of n$^-$/p$^-$/n$^+$/p$^+$, thereby making it difficult to form normal three structure device. If the impurity concentration of the p$^+$-type substrate is set to $2 \times 10^{18}$ cm$^{-3}$ through $8 \times 10^{18}$ cm$^{-3}$, the above problem is solved and a switching speed is increased. This is because current gain $\alpha_{pnp}$ is reduced by using the p$^+$-type substrate with the impurity concentration from $2 \times 10^{18}$ cm$^3$ to $8 \times 10^{18}$ cm$^{-3}$. If the concentration is lower than $2 \times 10^{18}$ cm$^{-3}$, a good ohmic contact with a drain electrode is difficult to attain and a forward voltage drop becomes large.

Figure 5B:
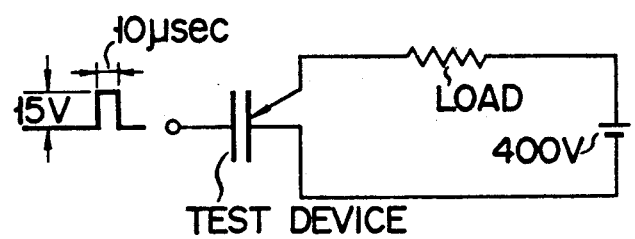
FIG. 5B is a schematic illustrating the application of a constant voltage to a test device constructed in accordance with FIG. 3.
Figure 5C:
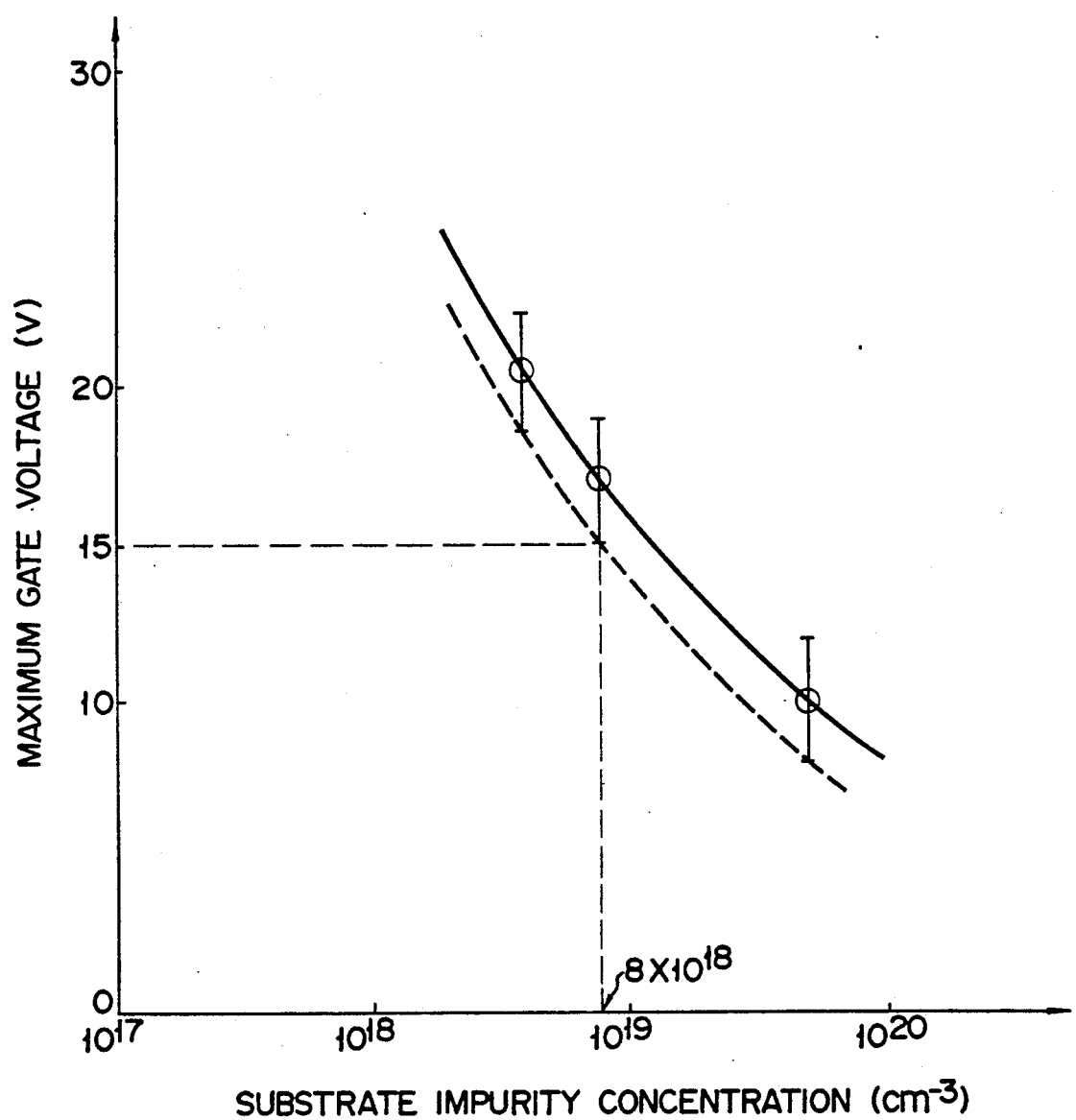
FIG. 5C is a graph showing the relationship between the impurity concentration of a test device of FIG. 5B and the maximum gate voltage without damage.

Assuming that a test device of a withstanding voltage of 600 V is directly connected to a constant voltage power supply of 400 V as shown in FIG. 5B and an ON pulse is applied to a gate for 10 microseconds, the forward voltage drop of an element becomes 400 V and an electric current flows as much as it does. FIG. 5C shows the relation between the impurity concentration of the substrate of the test device and the maximum gate voltage which can be applied to the test device without damaging it. In FIG. 5C, a solid line indicates the average of the measurements obtained, and a broken line indicates the lower limit of 90% of the measurements. As can be clearly seen in FIG. 5C, if the substrate impurity concentration is set at $8 \times 10^{18}$ cm$^{-3}$, 90% of the devices will not be damaged, even when a gate voltage of 15 V is applied to the gate of the device. If a voltage of 15 V is applied to the gate of an element whose substrate impurity concentration is high, a great current flows into the element, thereby destroying the element. When the substrate impurity concentration is $8 \times 10^{18}$ cm$^{-3}$ or less, the hole injection from a P+ drain is suppressed. Therefore, no great current flows and the element is not destroyed even if the voltage of 15 V is applied to the gate and the forward voltage drop is 400 V.

The current flowing when a great voltage is applied to an element is substantially in proportion to the logarithm of the substrate impurity concentration. Usually, there is a load between an element and a power supply. When an accident happens, the load may be short-circuited and a power supply voltage may be directly applied to the element. An element is usually used when a voltage of 15 V or less is applied to a gate. If the substrate impurity concentration is $8 \times 10^{18}$ cm$^{-3}$ or less, the element is not destroyed for 10 microseconds even when the load is short-circuited. The element is thus prevented from being destroyed by turning off the element before a lapse of 10 microseconds. In an element having a current density of 100 A/cm$^2$, the forward voltage drop is hardly increased in spite of the low substrate impurity concentration.

As a result, a COM device having a good characteristic can be obtained by setting the total amount of impurities in the n$^+$-type buffer region between $5 \times 10^{13}$ cm$^{-2}$ and $1 \times 10^{15}$ cm$^{-2}$, increasing the impurity concentration of the n+ buffer region more than $3 \times 10^{16}$ cm$^{-3}$, and setting the impurity concentration of the p$^+$-type substrate between $2 \times 10^{18}$ cm$^{-3}$ and $8 \times 10^{18}$ cm$^{-3}$.

Figure 6:
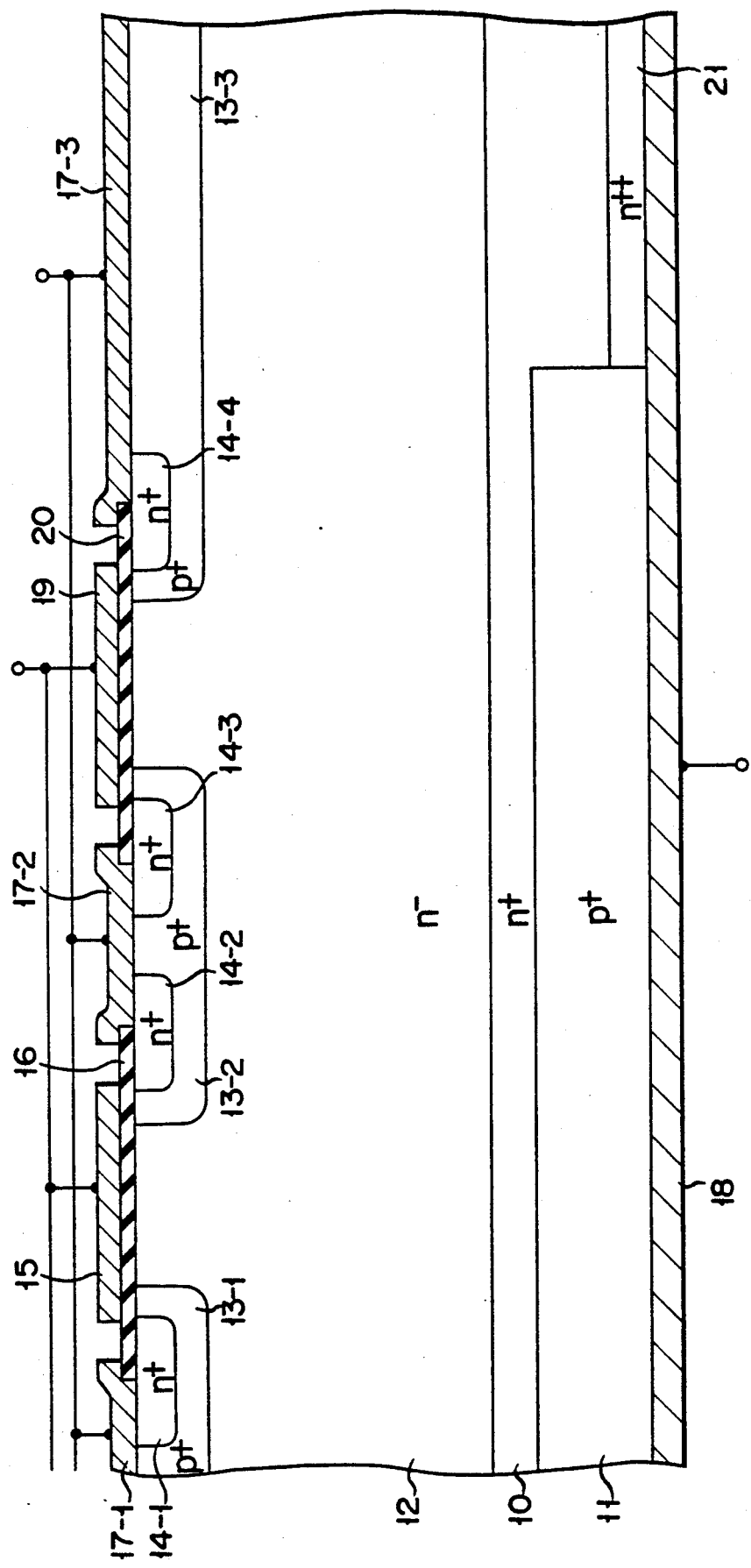
FIG. 6 is a schematic cross-sectional diagram showing a COM switching device having a reverse conducting diode according to another embodiment of the invention.

FIG. 6 shows a COM switching device having a reverse conducting diode according to another embodiment of the invention. The main part of this COM switching device is constructed similar to the COM switching device shown in FIG. 3 and includes the p$^+$-type layer 11, n$^+$-type layer 10, n$^-$-type high resistance layer 12, p$^+$-type regions 13-1 and 13-2, n$^+$-type regions 14-1 and 14-2, source electrodes 17-1 and 17-2, and gate electrode 15. This COM switching device further includes a p$^+$-type region 13-3 formed in the surface area of the n$^-$-type layer 12 to face the p$^+$-type region 13-2; an n$^+$-type region 14-3 formed in the surface region of the p$^+$-type region 13-2 to face the n$^+$-type region 14-2; and an n$^+$-type region 14-4 formed in the surface area of the p$^+$-type region 13-3. A gate electrode 19 is formed on an insulating layer 20 over the surface regions of the p$^+$-type regions 13-2 and 13-3 and n$^-$-type layer 12 between the n$^+$-type regions 14-3 and 14-4. An electrode 17-3 is formed in ohmic contact with the p$^+$-type region 13-3 and with n$^+$-type region 14-4. Further, in this COM switching device, for example, the n$^-$-type layer 12 is formed by a silicon substrate and the n$^+$-type layer 10 is formed under the n$^-$-type substrate 12 by a vapor phase growth method or thermal diffusion technique to have a thickness of about 15 μm and an impurity concentration of $6 \times 10^{17}$/cm$^3$. The p$^+$-type layer 11 is formed in the surface area of the n$^+$-type layer 10 at the location where the layer 11 faces the n$^+$-type regions 14-1 to 14-4 so as to have a thickness of 5 to 8 μm. An n$^{++}$-type layer 21 having a surface concentration of about $3 \times 10^{20}$/cm$^3$ is formed in the residual surface region of the n$^+$-type region 10. The p$^+$-type regions 13-1 and 13-2 are formed to have a surface concentration of about $4 \times 10^{17}$/cm$^3$, and the p$^+$-type regions 11 and 13-3 are formed to have a sufficiently high surface concentration of about $5 \times 10^{19}$/cm$^3$.

In the COM switching device shown in FIG. 6, the n$^{++}$-type layer 21 and portions of the n$^+$-type layer 10, n$^-$-type layer 12 and p$^+$-type region 13-3 which are formed on or over the n$^{++}$-type layer 21 cooperate to constitute a reverse conducting diode, that is, the diode section of this COM switching device is constituted so as to have the p-i-n (p$^+$-type region 13-3, n$^-$-type layer 12 and n$^+$-type layers 10 and 21) structure. Therefore, the reverse recovering time in this diode section is short. On the other hand, in the MOSFET section of this COM switching device, the gate electrodes 15 and 19 are mutually electrically coupled and the source electrodes 17-1 to 17-3 are also mutually electrically coupled. In principle, this MOSFET section operates similar to the switching device shown in FIG. 3.

By radiating an electron beam, neutron beam or gamma beam to the MOSFET section and to the diode section of the COM switching device shown in FIG. 6, it is possible to control the lifetimes $\tau T$ and $\tau D$ of the minority carriers in the respective sections. Also, these lifetimes $\tau T$ and $\tau D$ can be controlled by diffusing heavy metal such as gold, platinum, or the like. There is no need to set these lifetimes $\tau T$ and $\tau D$ to the same value. For instance, in case of shortening the reverse recovering time in the diode section, $\tau T$ can be set to a value larger than $\tau D$.

In this embodiment as well, the p+-type layer 11 is formed to extend more to the right than the n+-type region 14-4 in the diagram. This makes it possible to prevent malfunctions such as with the parasitic thyristor, which is constructed of the p+-type layer 11, n+type layer 10, n−-type layer 12, p+-type region 13-3, and n+-type region 14-4, being turned on owing to the carriers left in the n−-type layer 12 after the conductive state of the reverse conducting diode is terminated.

As described above, in the embodiment, the diode section can be easily formed using the n+-type layer 10, n−-type layer 12 and p+-type region 13-3 in the MOSFET section.

Figure 7:
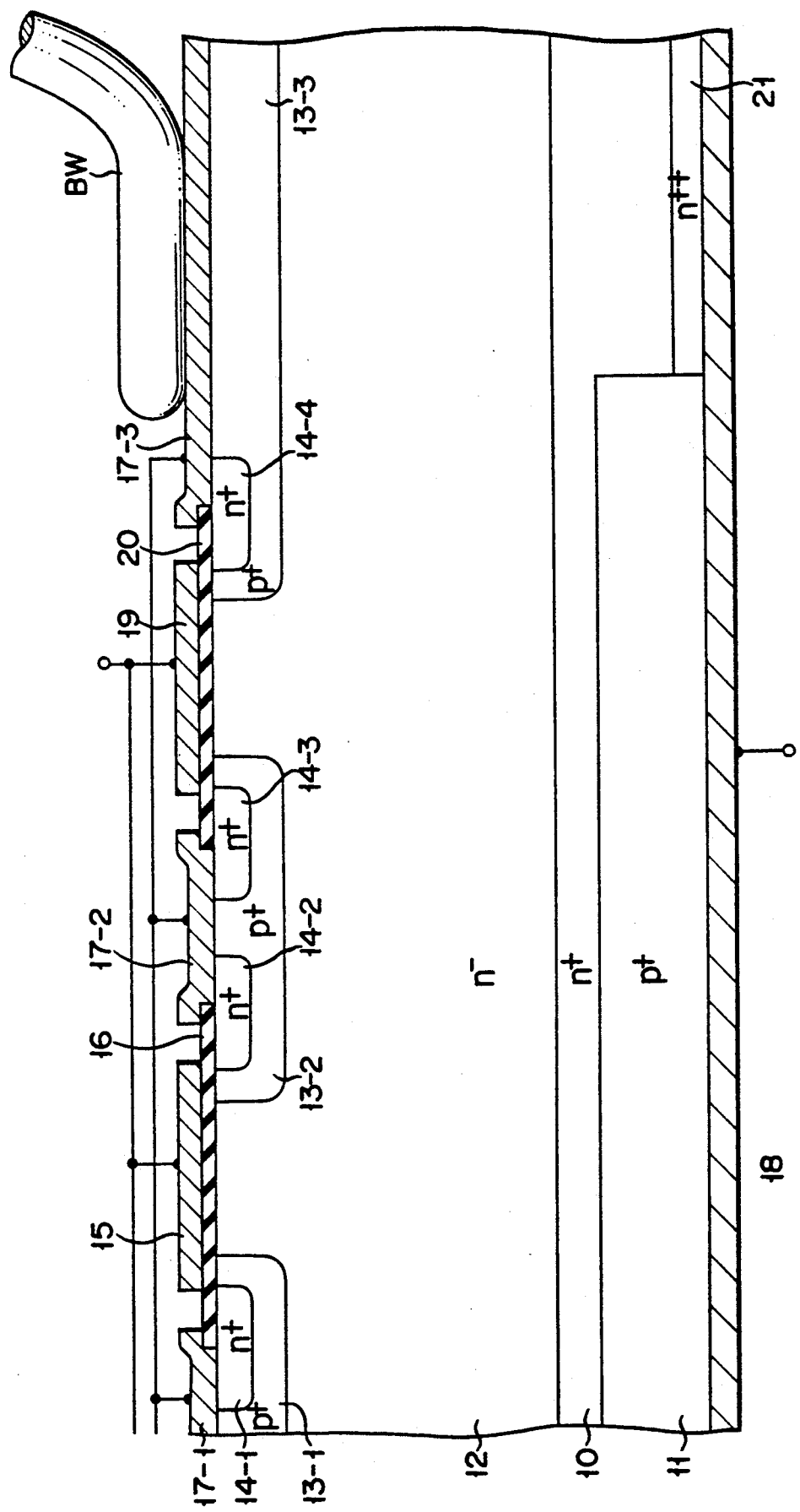
FIG. 7 shows a modified form of the COM switching device shown in FIG. 6.

FIG. 7 shows a modified form of the COM switching device shown in FIG. 6. The COM switching device shown in FIG. 7 is constructed similar to that shown in FIG. 6 except that a bonding wire BW is formed over the portion of the source electrode 17-3 in contact with the p+-type region 13-3. In this case, since the diode section includes the p+-type region 13-3, n−-type layer 12, n+-type layer 10, and n++-type layer 21 below the bonding wire BW, this diode section can be formed without substantially increasing the area of the chip.

Figure 8:
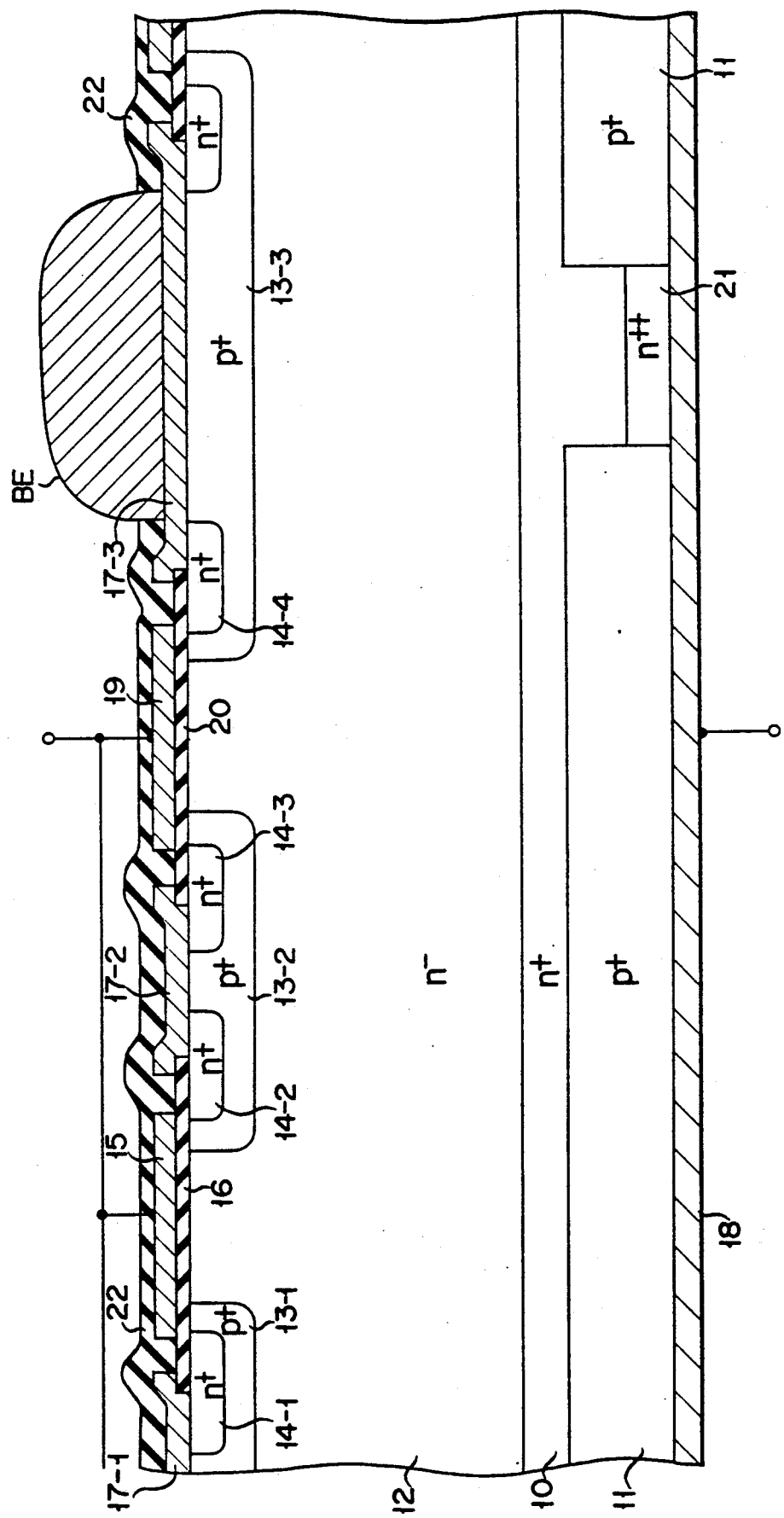
FIG. 8 shows another modified form of the COM switching device shown in FIG. 6.

FIG. 8 shows another modified form of the COM switching device shown in FIG. 6. This switching device is constructed substantially similar to that shown in FIG. 6 except that a bump electrode BE is formed on the source electrode 17-3. This bump electrode BE is formed in a manner such that, for instance, an insulating layer 22 is formed on the whole surface of the semiconductor structure and the portion of the insulating layer 22 corresponding to the central part of the source electrode 17-3 is removed. Then, a solder is adhered onto the central part of the source electrode 17-3 which was exposed as described above. By forming such a number of bump electrodes and by respectively adhering to external terminals with pressure, a large current can flow through these bump electrodes. Even in this case, the diode section can be formed below the bump electrode BE and the diode section can be formed without increasing the area of the chip.

Figure 9:
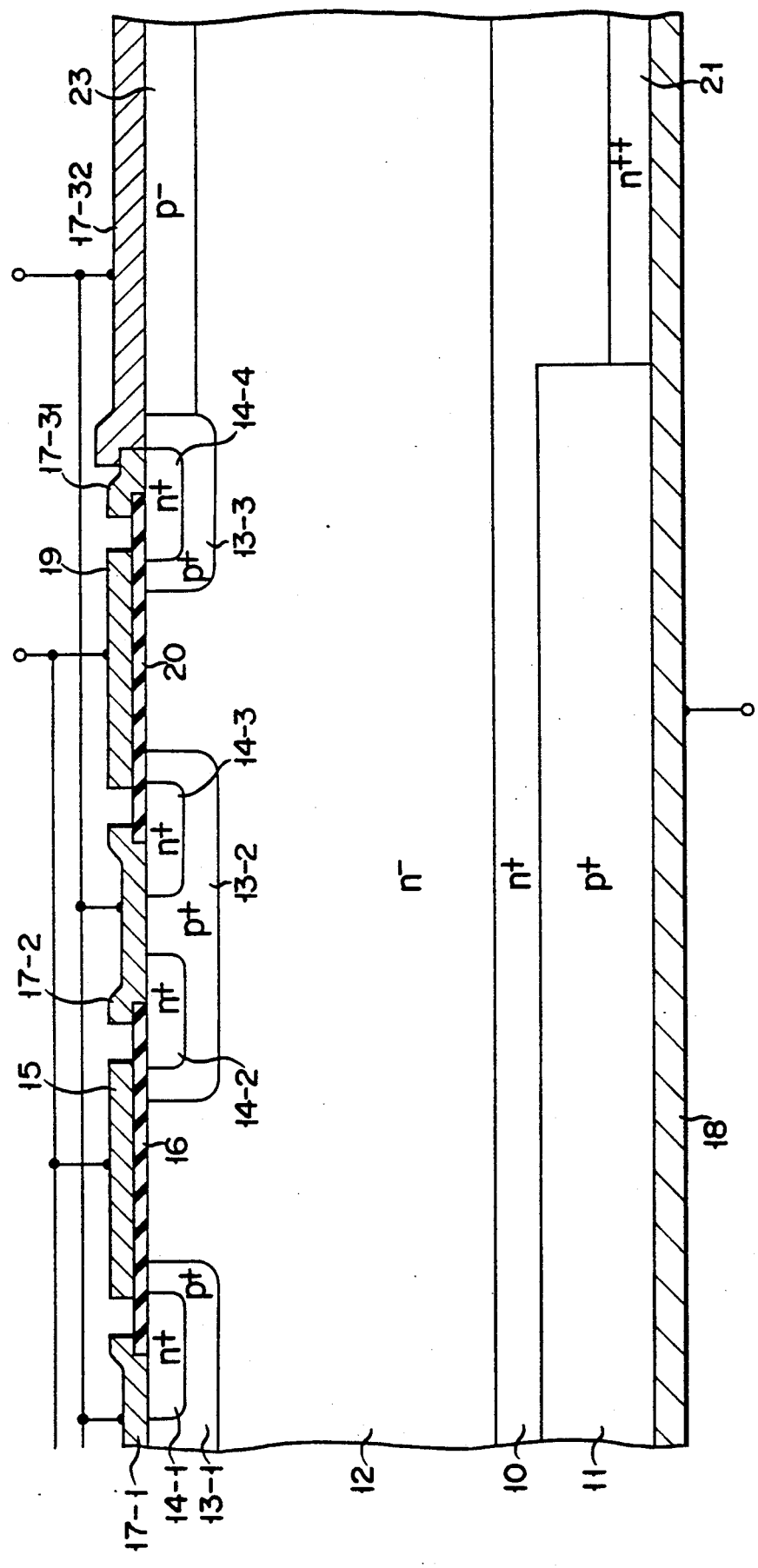
FIG. 9 is a schematic cross-sectional diagram showing a COM switching device having a reverse conducting diode of the Schottky type according to another embodiment of the invention.

FIG. 9 shows a COM switching device according to another embodiment of the invention. This COM switching device is substantially similar to that shown in FIG. 6 except that a
−-type region 23 is formed in the surface area of the n−-type region 12 in contact with the p+-type region 13-3 which is so formed as to surround the n+-type region 14-4. In place of the source electrode 17-3, an electrode 17-31 is formed on the n+-type region 14-4 and a Schottky electrode 17-32 such as platinum, or the like, is formed on the p+-type region 13-3 and p−-type region 23 in contact with the electrode 17-31. In this way, by selecting the material of the Schottky electrode 17-32, what is called a bipolar mode Schottky diode is formed which utilizes the effect of injected minority carriers.

Figure 10:
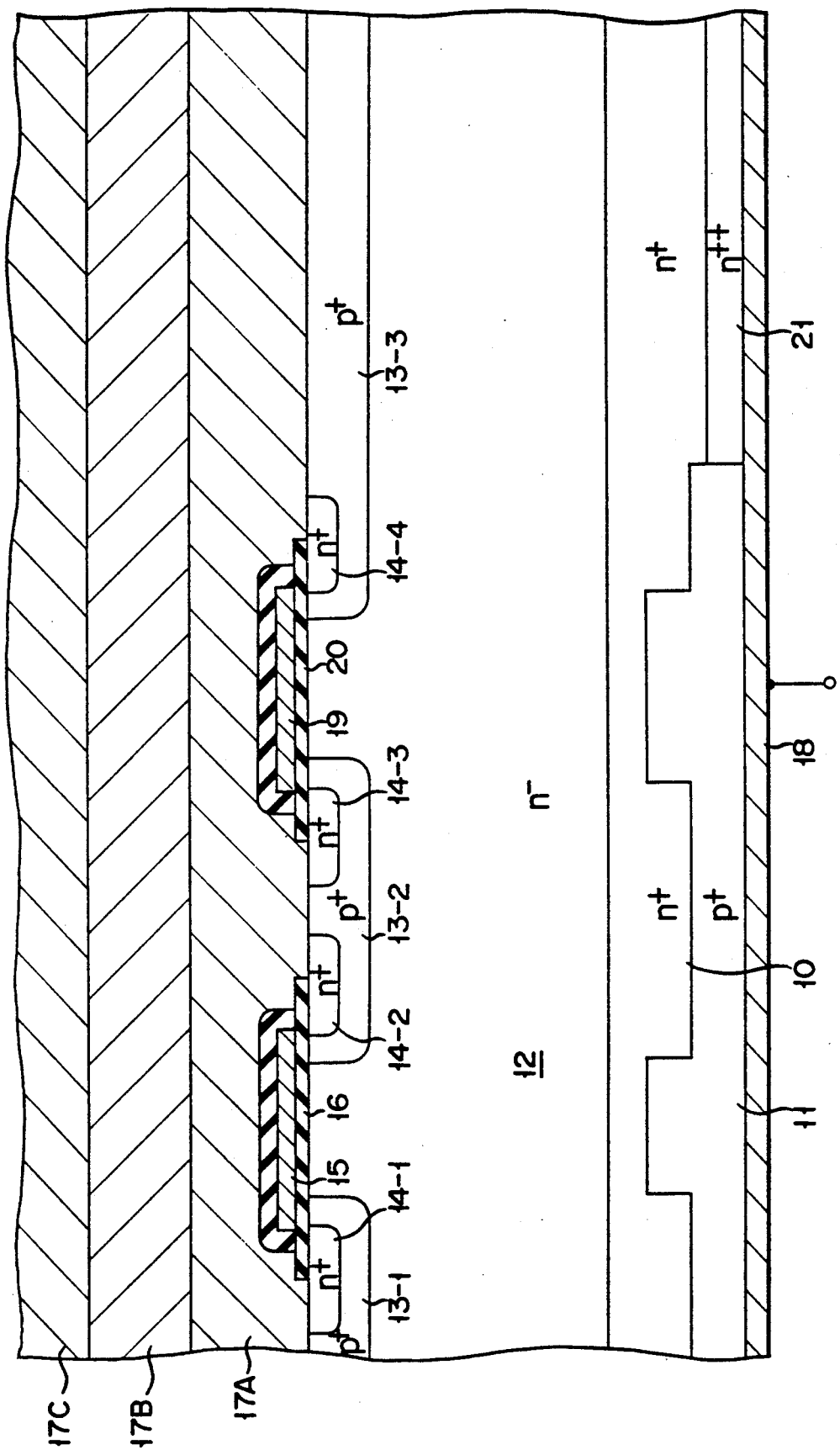
FIG. 10 is a modification of the COM switching device of FIG. 6.

FIG. 10 shows a COM switching device according to another embodiment of the invention. This COM switching device is constructed substantially similar to that shown in FIG. 6 except that the p+-type layer 11 is formed in the surface area of the n+-type layer 10 so as to have partially different depths. The amount of impurities in the n+-type layer 10 in the shallow portion of the p+-type layer 11 is larger than $5 \times 10^{13}/cm^2$, thereby preventing the injection of the minority carriers or holes into the n−-type layer 12 through the n+-type layer 10 at this portion. Thus, the turn-off time is shortened and the switching speed of this COM switching device is improved.

In addition, in this embodiment, the gate electrodes 15 and 19 are formed of polycrystalline silicon and covered by silicon oxide layers. A source electrode 17A is formed on and over the electrode 17-32, p+-type regions 13-1 and 13-3, n+-type regions 14-1 to 14-4, and silicon oxide layers. A metal layer 17B is formed on the source electrode 17A for improvement in adhesive property with a solder layer 17C.

Although the present invention has been described with respect to the embodiments, the invention is not limited to these embodiments. For instance, the p- and n-type semiconductor regions or layers used in these embodiments may be changed to n- and p-type semiconductor regions or layers, respectively.

Also, the n++-type region 21 may be omitted when the n+-type layer 10 has a high impurity concentration such that it can come into ohmic contact with the drain electrode 18.

What is claimed as new and desired to be secured by letters patent of the United States is:

1. A conductivity modulated semiconductor device comprising:

a semiconductor substrate of a P type having a constant impurity concentration;

a first epitaxial semiconductor layer of an N type which is formed on said semiconductor substrate and has an amount of impurities per unit area of between $5 \times 10^{13}$ cm$^{-2}$ and $1 \times 10^{15}$ cm$^{-2}$;

a second epitaxial semiconductor layer of the N type which has an impurity concentration lower than that of said first epitaxial semiconductor layer and is formed on said first epitaxial semiconductor layer;

at least one first semiconductor region of the P type formed in a surface area of said second epitaxial semiconductor layer;

at least one second semiconductor region of the N type formed in a surface area of said first semiconductor region;

a gate electrode formed on an insulation layer over the surface area of said first semiconductor region which lies between said second epitaxial semiconductor layer and said second semiconductor region;

a source electrode formed in contact with said first and second semiconductor regions; and a drain electrode formed in contact with said semiconductor substrate.

2. A semiconductor device according to claim 1, in which said first epitaxial semiconductor layer has a main region formed on said semiconductor substrate and an additional region in ohmic contact with said drain electrode, and which further comprises a third semiconductor region of the P type which is formed in the surface area of the part of said second epitaxial semiconductor layer which is formed on said additional region, and a part of said source electrode being formed on said third semiconductor region.

3. A semiconductor device according to claim 2, wherein said third semiconductor region is formed integrally with said first semiconductor region.

4. A semiconductor device according to claim 3, further comprising a bonding wire which is formed in contact with a portion of said source electrode which is formed on said third semiconductor region.

5. A semiconductor device according to claim 3, further comprising a bump electrode which is formed in contact with a portion of said source electrode which is formed on said third semiconductor region.

6. A semiconductor device according to claim 3, wherein the main region of said first epitaxial semiconductor layer is formed to have different thicknesses.

7. A semiconductor device according to claim 2, wherein said third semiconductor region has a lower impurity concentration than said first semiconductor region.

8. A semiconductor device according to claim 7, wherein a portion of said source electrode formed on said third semiconductor region is a Schottky electrode which, together with said third semiconductor region, forms a Schottky diode.

9. A semiconductor device according to claim 1, wherein said first epitaxial semiconductor layer is formed to have different thicknesses.

10. A semiconductor device according to claim 1, wherein
the constant impurity concentration of said substrate is higher than $2 \times 10^{18}$ cm$^{-3}$.

11. A semiconductor device according to claim 10, wherein
the constant impurity concentration of said substrate is lower than $8 \times 10^{18}$ cm$^{-3}$.

12. A conductivity modulated semiconductor device comprising:
a semiconductor substrate of a first conductivity type;
a first epitaxial semiconductor layer of a second conductivity type which is formed on said semiconductor substrate and has an amount of impurities per unit area of between $5 \times 10^{13}$ cm$^{-2}$ and $1 \times 10^{15}$ cm$^{-2}$;
a second epitaxial semiconductor layer of the second conductivity type which has an impurity concentration lower than that of said first epitaxial semiconductor layer and is formed on said first epitaxial semiconductor layer;
at least one first semiconductor region of the first conductivity type formed in a surface area of said second epitaxial semiconductor layer;
at least one second semiconductor region of the second conductivity type formed in a surface area of said first semiconductor region;
a gate electrode formed on an insulation layer over the surface area of said first semiconductor region which lies between said second epitaxial semiconductor layer and said second semiconductor region;
a source electrode formed in contact with said first and second semiconductor regions; and
a drain electrode formed in contact with said semiconductor substrate.

13. A semiconductor device according to claim 12, wherein
said substrate has an impurity concentration higher than $2 \times 10^{18}$ cm$^{-3}$.

14. A semiconductor device according to claim 13, wherein
said substrate has an impurity concentration lower than $8 \times 10^{18}$ cm$^{-3}$.

15. A semiconductor device according to claim 14, wherein
said impurity concentration of said substrate is constant.

16. A semiconductor device according to claim 12, wherein
said first epitaxial semiconductor layer has a main region formed on said semiconductor substrate and an additional region in ohmic contact with said drain electrode, and which further comprises a third semiconductor region of the first conductivity type which is formed in the surface area of the part of said second epitaxial semiconductor layer which is formed on said additional region, and a part of said source electrode being formed on said third semiconductor region.

17. A semiconductor device according to claim 16, wherein
said third semiconductor region is formed integrally with said first semiconductor region.

18. A semiconductor device according to claim 17, further comprising:
a bonding wire which is formed in contact with a portion of said source electrode which is formed on said third semiconductor region.

19. A semiconductor device according to claim 17, further comprising:
a bump electrode which is formed in contact with a portion of said source electrode which is formed on said third semiconductor region.

20. A semiconductor device according to claim 17, wherein
the main region of said first epitaxial semiconductor layer is formed to have different thickness.

21. A semiconductor device according to claim 16, wherein
said third semiconductor region has a lower impurity concentration than said first semiconductor region.

22. A semiconductor device according to claim 21, wherein
a portion of said source electrode formed on said third semiconductor region is a Schottky electrode which, together with said third semiconductor region, forms a Schottky diode.

23. A semiconductor device according to claim 12, wherein
said first epitaxial semiconductor layer is formed to have different thicknesses.

* * * * *